US010648562B2

United States Patent
Yu

(10) Patent No.: US 10,648,562 B2
(45) Date of Patent: May 12, 2020

(54) RUBBER GASKET

(71) Applicant: NOK CORPORATION, Tokyo (JP)

(72) Inventor: Nan Yu, Kumamoto (JP)

(73) Assignee: NOK CORPORATION, Tokyo (JP)

( * ) Notice: Subject to any disclaimer, the term of this patent is extended or adjusted under 35 U.S.C. 154(b) by 207 days.

(21) Appl. No.: 15/518,336

(22) PCT Filed: Sep. 17, 2015

(86) PCT No.: PCT/JP2015/076392
§ 371 (c)(1),
(2) Date: Apr. 11, 2017

(87) PCT Pub. No.: WO2016/059933
PCT Pub. Date: Apr. 21, 2016

(65) Prior Publication Data
US 2018/0283554 A1 Oct. 4, 2018

(30) Foreign Application Priority Data

Oct. 17, 2014 (JP) .................................. 2014-212461

(51) Int. Cl.
*F16J 15/06* (2006.01)
*F16J 15/10* (2006.01)
*H05K 5/06* (2006.01)

(52) U.S. Cl.
CPC ............. *F16J 15/062* (2013.01); *F16J 15/10* (2013.01); *F16J 15/106* (2013.01); *H05K 5/06* (2013.01); *H05K 5/061* (2013.01)

(58) Field of Classification Search
CPC ......... F16J 15/062; F16J 15/10; F16J 15/106; F16J 15/102; F16J 15/06; H05K 5/06; H05K 5/061

(Continued)

(56) References Cited

U.S. PATENT DOCUMENTS 2,954,264 A * 9/1960 Tisch ...................... F16J 15/32
277/630
3,052,478 A * 9/1962 Horvereid ................ F16J 15/32
277/394

(Continued)

FOREIGN PATENT DOCUMENTS

CN        2703166 Y     6/2005
CN      101542170 A     9/2009

(Continued)

OTHER PUBLICATIONS

Extended European Search Report for Application No. 15 85 1516 dated Dec. 7, 2017 (8 pages).

(Continued)

*Primary Examiner* — Nathan Cumar
(74) *Attorney, Agent, or Firm* — Harness, Dickey & Pierce, P.L.C.

(57) ABSTRACT

A rubber gasket is interposed between opposing two members in a state of being held in a fitting groove formed in one of two members, and includes a concave surface located in a central area in a width direction thereof and extending in a circumferential direction thereof, and seal beads located on both sides of the concave surface in the width direction thereof. The concave surface and the seal beads are formed in each of a surface of the rubber gasket facing a bottom surface of the fitting groove and a surface of the rubber gasket facing the other of two members. Assuming that a maximum depth of the concave surface is D, and a height between the seal beads facing the bottom surface of the fitting groove and the seal beads on an opposite side thereto is A, the expression $D=0.025A \sim 0.075A$ (1) is satisfied.

2 Claims, 3 Drawing Sheets

(58) Field of Classification Search
USPC .......................................................... 277/644
See application file for complete search history.

(56) References Cited

U.S. PATENT DOCUMENTS

| | | | |
|---|---|---|---|
| 3,362,568 A | | 1/1968 | Brandt et al. |
| 3,472,523 A | * 10/1969 | Carlson, Jr. | ............ F16J 15/024 |
| | | | 277/649 |
| 3,642,293 A | * 2/1972 | Woodling | ................ F16J 15/32 |
| | | | 277/558 |
| 4,448,429 A | * 5/1984 | Thomas | ................... F16J 15/32 |
| | | | 277/582 |
| 5,002,290 A | * 3/1991 | Pernin | .................... F16J 15/024 |
| | | | 277/649 |
| 5,040,905 A | * 8/1991 | Boyd | ..................... F16C 17/02 |
| | | | 384/130 |
| 5,915,696 A | | 6/1999 | Onuma et al. |
| 2006/0220326 A1 | * 10/2006 | Leadley-Brown | ..... F16J 15/025 |
| | | | 277/609 |
| 2012/0267864 A1 | | 10/2012 | Watanabe et al. |
| 2015/0097344 A1 | | 4/2015 | Hamamoto |

FOREIGN PATENT DOCUMENTS

| | | |
|---|---|---|
| CN | 202327080 U | 7/2012 |
| CN | 103968072 A | 8/2014 |
| CN | 203868317 U | 10/2014 |
| GB | 1556870 A | 11/1979 |
| JP | H09-096364 A | 4/1997 |
| JP | H09-144889 A | 6/1997 |
| JP | 2001-027326 A | 1/2001 |
| JP | 2002-195411 A | 7/2002 |
| JP | 2002-364753 A | 12/2002 |
| JP | 2003-329139 A | 11/2003 |
| JP | 2006-132603 A | 5/2006 |
| JP | 2007-232014 A | 9/2007 |
| JP | 2011-094667 A | 5/2011 |
| JP | 2011-117466 A | 6/2011 |

OTHER PUBLICATIONS

Extended European Search Report for Application No. EP 14 85 2762 dated Sep. 21, 2016 (7 pages).

* cited by examiner

RUBBER GASKET

CROSS-REFERENCE TO RELATED APPLICATIONS

This application is a U.S. National Stage Application of International Application No. PCT/JP2015/076392, filed on Sep. 17, 2015, and published in Japanese as WO 2016/059933 A1 on Apr. 21, 2016 and claims priority to Japanese Application No. 2014-212461, filed on Oct. 17, 2014. The entire disclosures of the above applications are incorporated herein by reference.

BACKGROUND OF THE INVENTION

Field of the Invention

The present invention relates to a rubber gasket that maintains airtightness between two opposing surfaces such as a housing member and a cover member of a device, for example between contact surfaces of separate parts of a case that houses a power control unit (PCU) of a hybrid vehicle or an electric vehicle, by being interposed therebetween surfaces.

Description of the Conventional Art

The rubber gaskets for example, as shown in FIGS. 5A and 5B have been conventionally known as a rubber gasket, which is interposed between the contact surfaces of separate parts of a case that houses a power control unit (PCU) of a hybrid vehicle or an electric vehicle.

Of these, a rubber gasket 100 shown in FIG. 5A has a substantially rectangular cross-sectional shape when cut along an orthogonal plane to its extending direction, and has planar tight contact surfaces 100a and 100a with a counterpart member (a case, not shown). Meanwhile, a rubber gasket 200 shown in FIG. 5B includes seal beads 201 and 201 formed as ridges in opposing surfaces to the counterpart member (the case, not shown), on both ends in a width direction thereof (refer, for example, to Japanese Unexamined Patent Publication No. 2003-329139).

SUMMARY OF THE INVENTION

Problem to be Solved by the Invention

However, the rubber gasket 100 shown in FIG. 5A has a wide tight contact width with the counterpart member, and thus the sealing performance is not easily deteriorated even in the case where a foreign object has entered at the tight contact surface 100a. On the contrary, the gasket has a large counterforce against compression, which is problematic in that the gasket is prone to exert adverse effects such as deformation or strain on the counterpart member.

Meanwhile, the rubber gasket 200 shown in FIG. 5B is advantageous in that the seal beads 201 and 201 increase a peak surface pressure, which ensures a good sealing performance. Furthermore, since valley parts 202 between the seal beads 201 and 201 reduce counterforce against the compression, the gasket is less prone to exert adverse effects such as deformation or strain on the counterpart member. However, the tight contact width is narrow in the case where only the seal beads 201 and 201 are in tight contact with the counterpart member. There is thus a problem in that in the case where foreign objects D have entered at both tight contact surfaces of the seal beads 201 and 201, for example as shown in FIG. 6, gaps formed with the counterpart member when the foreign objects D are pinched will communicate with each other through the valley part 202. As a result, a leakage channel L is prone to be formed. Bringing the entire surface including the valley part 202 into tight contact with the counterpart member is effective for preventing the leakage channel L from being formed. However, the valley part 202 is deep, and thus a high compression rate is required for bringing the entire surface into tight contact. Ultimately, this may increase compression counterforce.

The present invention is made by taking into consideration the above-described points, and a technical object of the present invention is to provide a rubber gasket capable of improving sealing performance, while also having a low counterforce so as not to exert adverse effects such as deformation or strain on a counterpart member.

Means for Solving the Problem

As a means to effectively solve the above-described technical problems, a rubber gasket according to the invention of a first aspect is interposed between two members that are opposed to each other in a state of being held in a fitting groove formed in one of the two members. The rubber gasket includes a concave surface located in a central area in a width direction of the rubber gasket and extending in a circumferential direction thereof, and seal beads located on both sides of the concave surface in the width direction thereof. The concave surface and the seal beads are formed in each of a surface of the rubber gasket that faces a bottom surface of the fitting groove and a surface of the rubber gasket that faces the other of the two members. On the assumption that a maximum depth of the concave surface is represented by D, and a height between the seal beads facing the bottom surface of the fitting groove and the seal beads on an opposite side thereto is represented by A, the following expression is satisfied:

$$D=0.025A \sim 0.075A \qquad (1).$$

The rubber gasket configured as described above has the maximum depth D of the concave surface set as indicated in the expression (1). As a result, the rubber gasket fitted at a normal compression rate (a rate of approximately 20% or a rate close thereto) makes contact with the bottom surface of the fitting groove, which is formed in the one of the two members, at the entirety or almost the entirety of the surface of the rubber gasket facing the bottom surface. The rubber gasket also makes contact with the other of the two members at the entirety or almost the entirety of the surface of the rubber gasket on the opposite side. Here, the maximum depth D of the concave surface is set as indicated in the expression (1) for the following reason. That is, if D is greater than 0.075A, the rubber gasket fitted at the normal compression rate may apply insufficient surface pressure at the seal beads thereof, which results in poor sealing performance and a lower resistance to the entry of foreign objects, even if the rubber gasket is disposed between the bottom surface of the fitting groove formed in the one member and the other member in a compressed state such that the concave surfaces and the seal beads on both sides thereof in the width direction make contact with the bottom surface and the other member. On the other hand, if D is less than 0.025A, a counterforce will be too great, even at the normal compression rate. Under conditions indicated in the expression (1), the rubber gasket makes contact with the counterpart members at the entirety or almost the entirety of the surfaces, which can ensure a wide tight contact width (seal width). Thus, a leakage channel is less prone to be formed by foreign objects that have entered. Moreover, while a desired crush margin is set at the seal beads, the crush margin becomes lower at the concave surface, which can reduce the counterforce against the compression.

A rubber gasket according to the invention of a second aspect is the configuration described in the first aspect, wherein the seal beads are formed into an arc shape in a cross-sectional shape, which is orthogonal to an extending direction thereof, and a radius of curvature R of the arc-shaped cross-section of the seal beads satisfies the following relationship.

R<0.2B (2), in which a width between apexes of the seal beads on both sides in the width direction is represented by B.

With the rubber gasket configured as described above, a peak surface pressure can be kept high by setting the radius of curvature R of the arc-shaped cross-section of the seal beads as indicated in the expression (2), and thus even better sealing performance can be achieved.

A rubber gasket according to the invention of a third aspect is the configuration described in the first or second aspect, wherein the following expression is satisfied: D=0.02W~0.08W (3) in which a width of the rubber gasket is represented by W.

The maximum depth D of the concave surface is set as indicated in the expression (3) in the configuration described above for the following reasons. If D is greater than 0.08w, the seal beads may deform and collapse outward, which may lead to the insufficient surface pressure and poor sealing performance at the normal compression rate. On the other hand, if D is less than 0.02w, the surface pressure may increase, and the counterforce may become too great.

Effect of the Invention

According to the rubber gasket of the present invention, the concave surface having the maximum depth D between 0.025A and 0.075A is provided. The rubber gasket fitted at a normal compression rate applies a low counterforce on the counterpart member. As a result, adverse effects such as deformation or strain are not easily exerted on the counterpart members. Moreover, while the rubber gasket makes contact with the counterpart member at the entire surface or almost the entire surface of the rubber gasket, a wide seal width can be ensured, and the seal beads on both sides of the concave surface in the width direction thereof can ensure a superior sealing performance.

DETAILED DESCRIPTION OF PREFERRED EMBODIMENTS

Figure 1:
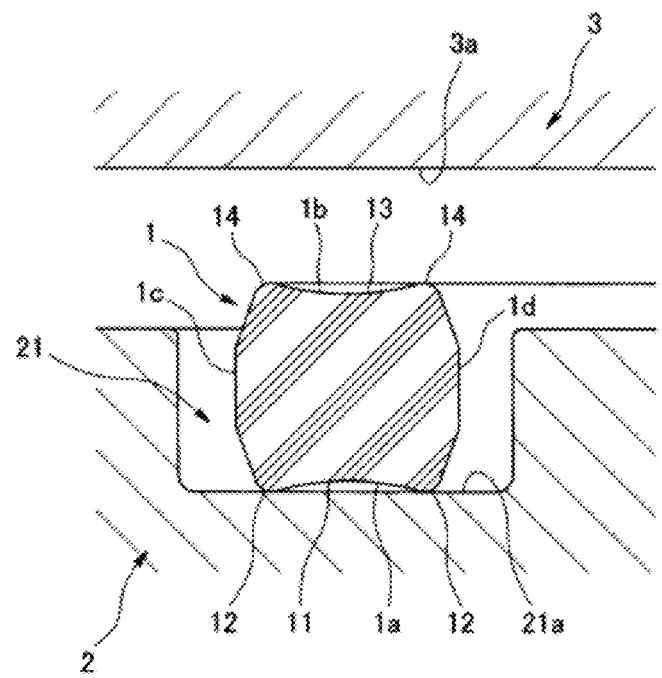
FIG. 1 is a cross-sectional view showing a preferred embodiment of a rubber gasket according to the present invention in an uncompressed state along with a counterpart member with which the rubber gasket is fitted.
Figure 2:
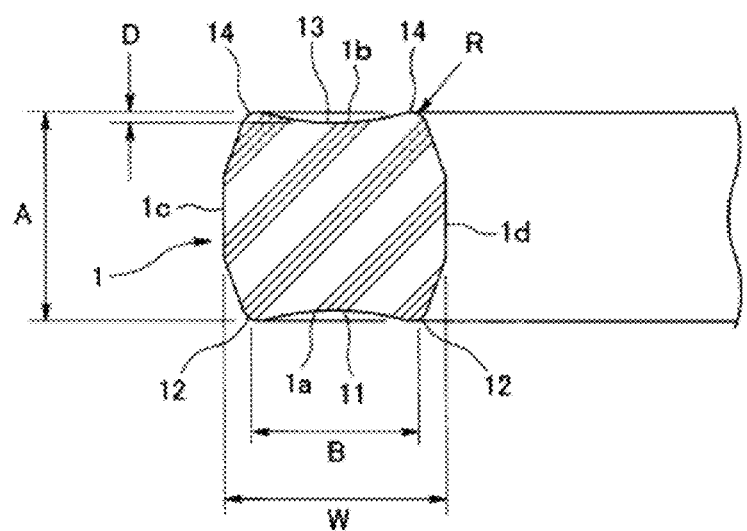
FIG. 2 is a cross-sectional view showing the preferred embodiment of the rubber gasket according to the present invention alone.

A preferred embodiment of a rubber gasket according to the present invention will be described hereinafter with reference to the drawings. FIG. 1 shows the rubber gasket in an uncompressed state along with a counterpart member with which the rubber gasket is fitted, and FIG. 2 shows the rubber gasket alone.

A rubber gasket 1 shown in FIG. 1 is interposed between two members that oppose and are joined to each other, in which one member (for example, a lower case of an inverter case that houses an inverter of a power control unit in a hybrid vehicle or an electric vehicle) 2 and the other member (for example, an upper case connected to the lower case) 3, in a state of being held in a fitting groove 21 formed in the one member 2. The rubber gasket 1 is made of a rubber-type elastic material (a rubber material or a synthetic resin material having a rubber-type elasticity), and preferably employs a material having a hardness of approximately $H_A 50$.

A concave surface 11 is located in a central area in a width direction of the rubber gasket 1 and extends in a circumferential direction of the rubber gasket 1. Seal beads 12 and 12 are located on both sides of the concave surface 11 in the width direction of the rubber gasket 1. The concave surface 11 and the seal beads 12 and 12 are formed in a surface 1a that faces a bottom surface 21a of the fitting groove 21 in the one member 2. Likewise, a concave surface 13 is located in a central area in the width direction of the rubber gasket 1 and extends in the circumferential direction of the rubber gasket 1. Seal beads 14 and 14 are located on both sides of the concave surface 13 in the width direction of the rubber gasket 1. The concave surface 13 and the seal beads 14 and 14 are formed in the opposite surface, that is a surface 1b that faces the other member 3.

The cross-sectional shape (the shape of a cross-section orthogonal to the extending direction) of the rubber gasket 1 is symmetrical with respect to the width direction (the lateral direction in FIG. 1) and symmetrical with respect to the opposing direction of the two members 2 and 3. Accordingly, the cross-sectional shapes of the seal beads 12 and 12 are symmetrical with respect to the width direction, the cross-sectional shapes of the seal beads 14 and 14 are symmetrical with respect to the width direction, the cross-sectional shapes of the seal beads 12 and 14 are symmetrical each other with respect to the opposing direction of the two members 2 and 3, and the cross-sectional shapes of the concave surfaces 11 and 13 are symmetrical each other with respect to the opposing direction of the two members 2 and 3.

As shown in FIG. 2, assuming that a maximum depth of the concave surfaces 11 and 13 is represented by D, and a height between the seal bead 12 facing the bottom surface side 21a of the fitting groove 21 and the seal bead 14 on the opposite side thereto is represented by A, the following expression is satisfied:

$$D=0.025A\text{~}0.075A \qquad (1).$$

Meanwhile, the cross-sectional shapes of the seal beads 12 and 14 are arc shapes, and assuming that a width between apexes of the seal beads 12 and 12 (between apexes of the seal beads 14 and 14) on both sides in the width direction is represented by B, a radius of curvature R of the arc-shaped cross-section of the seal beads 12 and 14 is as follows:

$$R < 0.2B \qquad (2).$$

Furthermore, the rubber gasket 1 is formed into such a shape that an outer circumferential surface 1c and an inner circumferential surface 1d opposing inner side surfaces 21b and 21c of the fitting groove 21 suitably bulge. Assuming that a width of the rubber gasket 1, more specifically a width between the bulging parts in the outer circumferential surface 1c and the inner circumferential surface 1d is represented by W, the maximum depth D of the concave surfaces 11 and 13 is as follows:

$$D = 0.02W \sim 0.08W \qquad (3).$$

Figure 3:
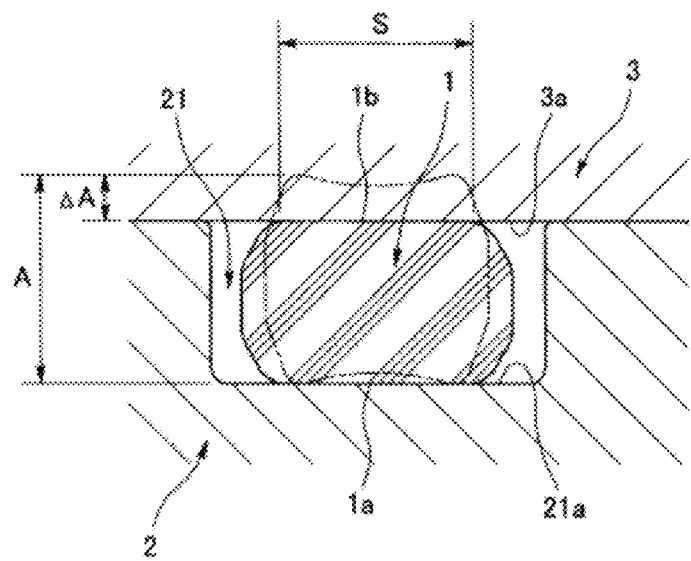
FIG. 3 is a cross-sectional view showing the preferred embodiment of the rubber gasket according to the present invention in a fitted state.

The rubber gasket 1 having the above-described configuration is fitted in a compressed state between the bottom surface 21a of the fitting groove 21 and an opposing surface 3a to the one member 2 in the other member 3 in a state of being held in the fitting groove 21 formed in the one member 2, thereby sealing a gap between the members 2 and 3. As shown in FIG. 3, when a crush margin of the rubber gasket 1 is represented by ΔA, the rubber gasket 1 fitted at a compression rate (=ΔA÷A×100), which becomes a normal compression rate (a rate of approximately 20% or a rate close thereto), ensures that the rubber gasket 1 makes tight contact with the bottom surface 21a of the fitting groove 21 and the contact surface 3a of the other member 3 at the entirety of the opposing surfaces 1a and 1b thereto, or makes contact with the bottom surface 21a of the fitting groove 21 and the contact surface 3a of the other member 3 at almost the entirety of the opposing surfaces 1a and 1b thereto. This is because the maximum depth D of the concave surfaces 11 and 13 formed in the surfaces 1a and 1b is set according to the expression (1).

Figure 4:
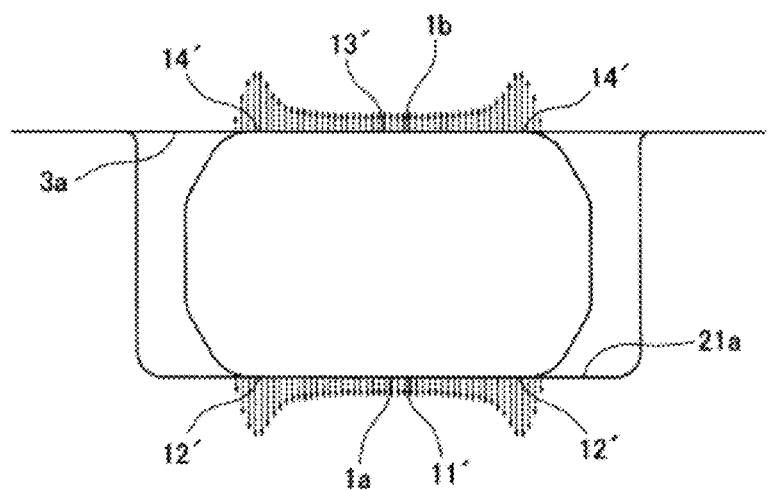
FIG. 4 is an explanatory diagram showing a surface pressure distribution in the preferred embodiment of the rubber gasket according to the present invention.
Figure 5A:
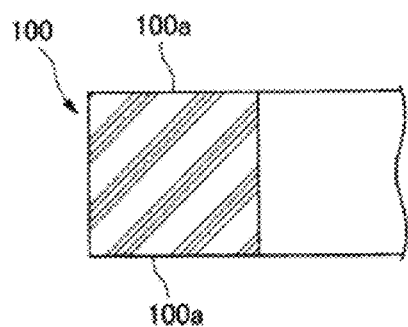
FIGS. 5A and 5B are cross-sectional views of a conventional rubber gasket.
Figure 5B:
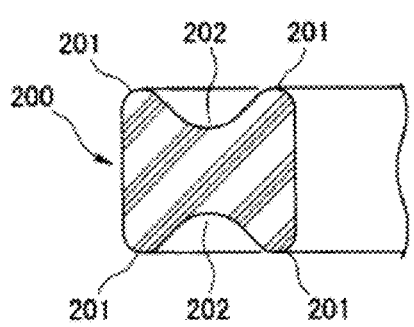
Figure 6:
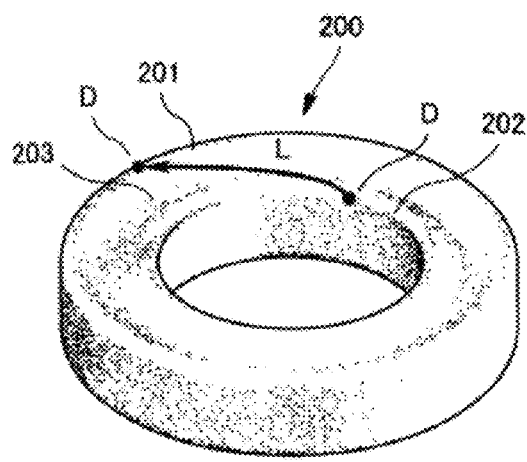
FIG. 6 is an explanatory diagram showing a forming condition of a leakage channel in the conventional rubber gasket.

A wide tight contact width S with the bottom surface 21a of the fitting groove 21 and the surface 3a of the other member 3 can be ensured by the tight contact or the almost contact of the surfaces 1a and 1b. Thus, foreign objects are less prone to enter and form a leakage channel. Meanwhile, a surface pressure distribution on the bottom surface 21a of the fitting groove 21 and the surface 3a of the other member 3, as indicated by multiple arrows in FIG. 4, has high peaks at parts 12' and 14' where the seal beads 12 and 14 are compressed. In particular, since a peak surface pressure becomes high by setting the radius of curvature R of the arc-shaped cross-section of the seal beads 12 and 14 as indicated by the expression (2) superior sealing performance can be achieved.

Furthermore, the crush margin ΔA is small at parts 11' and 13' of the concave surfaces 11 and 13. The parts 11' and 13' are parts of the surfaces 1a and 1b in tight contact with the bottom surface 21a of the fitting groove 21 and the surface 3a of the other member 3, respectively. Accordingly, even if the rubber gasket 1 is fitted at a normal compression rate, the rubber gasket 1 has a low counterforce in response to the compression. Adverse effects on the members 2 and 3, such as deformation or strain, can thus be effectively suppressed.

Meanwhile, if the maximum depth D of the concave surfaces 11 and 13 satisfies the expression (3) in addition to the expression (1), deformation of the seal beads, such as outward collapsing is hard to occur owing to D being within 0.08w. Thus good sealing performance is maintained at a normal compression rate. Furthermore, it is possible to prevent the counterforce from becoming too large owing to D being no less than 0.02w.

What is claimed is:

1. A rubber gasket interposed between two members that are opposed to each other and held in a fitting groove formed in one of the two members, the rubber gasket comprising:

a concave surface located in a central area in a width direction of the rubber gasket and extending in a circumferential direction thereof; and seal beads located on both sides of the concave surface in the width direction thereof, the concave surface and the seal beads being formed in each of a surface of the rubber gasket that faces a bottom surface of the fitting groove and a surface of the rubber gasket that faces the other of the two members, wherein side surfaces that connect the surface of the rubber gasket that faces the bottom surface of the fitting groove and the surface of the rubber gasket that faces the other of the two members each include a first section that bulges outward and extends from the surface of the rubber gasket that faces the other of the two members to a second section having an entire length thereof that extends orthogonal to the bottom surface of the fitting groove, and a third section that narrows inward and extends from the second section to the surface of the rubber gasket that faces the bottom surface of the fitting groove, D is a maximum depth of the concave surface, A is a height between the seal beads facing the bottom surface of the fitting groove and the seal beads on an opposite side thereto, $D = 0.025A$ to $0.075A$, wherein the seal beads are formed in an arc-shaped cross-section orthogonal to an extending direction thereto, R is a radius of curvature of the arc-shaped cross-section of the seal beads, B is a width between apexes of each of the seal beads on both sides in the width direction, and $R < 0.2B$.

2. The rubber gasket according to claim 1, wherein W is a maximum width between an outer circumferential surface and an inner circumferential surface of the rubber gasket, and $D = 0.02W$ to $0.08W$.

* * * * *